United States Patent [19]

Lewis

[11] 4,013,946
[45] Mar. 22, 1977

[54] MEANS FOR DETERMINING A FIRST MAGNETIC FIELD DIRECTION BY MEASURING SECONDARY MAGNETIC FIELDS INDUCED IN A BODY ROTATED IN SAID FIRST FIELD

[75] Inventor: John R. Lewis, Framingham, Mass.
[73] Assignee: Harnessed Energies, Inc., Maynard, Mass.
[22] Filed: Apr. 2, 1975
[21] Appl. No.: 564,284
[52] U.S. Cl. .................................. 324/43 R; 33/362
[51] Int. Cl.² ........................................ G01R 33/02
[58] Field of Search .............. 324/43 R, 47; 33/362
[56] References Cited

UNITED STATES PATENTS

| | | | |
|---|---|---|---|
| 2,049,232 | 7/1936 | Sydnes | 33/362 |
| 2,451,819 | 10/1948 | Frosch | 324/47 |
| 2,757,335 | 7/1956 | Bellugue | 324/47 |

OTHER PUBLICATIONS

McCutchen; C. W., Tim. a Brushless Generating Magnetometer, Jour. of Scien. Inst., vol. 36, Nov. 1959, pp. 471–474.

Primary Examiner—Robert J. Corcoran
Attorney, Agent, or Firm—Schiller & Pandiscio

[57] ABSTRACT

A phase-sensitive device for determining the direction of a primary magnetic field is disclosed which includes an electrically conductive rotor mounted for rotation about a predetermined axis. The rotor includes means for defining at least one electrical path. The device further comprises means for detecting those secondary magnetic field components induced by rotation of the rotor in the primary magnetic field which are of a frequency equal to the rotation frequency of the rotor and for providing a corresponding first electrical signal responsively to these secondary field components. Means are also provided for detecting the angular position of the rotor with respect to the rotation axis and for providing a second electrical signal corresponding to said angular position of the rotor. The relative phase shift of the first and second electrical signals can then be determined. This relative phase shift is related to the direction of the primary field.

19 Claims, 16 Drawing Figures

MEANS FOR DETERMINING A FIRST MAGNETIC FIELD DIRECTION BY MEASURING SECONDARY MAGNETIC FIELDS INDUCED IN A BODY ROTATED IN SAID FIRST FIELD

This invention relates to magnetometers and gaussmeters and more particularly to phase-sensitive gaussmeters which may be utilized as compasses.

Magnetometers and gaussmeters are devices which are used respectively, for measuring the magnitude and detecting the direction of ambient magnetic fields and thus are often used as compasses. One type of gaussmeter which is known employs a coil which is rotated about an axis which passes in a radial direction through the coil between the ends thereof. Each end of the coil which thus lies at diametrically-opposed sides of the rotation axis, is electrically coupled through slip-rings to a measuring instrument. As the coil is rotated in a magnetic field, a voltage is induced in the coil, the phase of which is dependent on the direction of the field. By comparing this induced voltage with a signal related to the instantaneous angular position of the coil, the direction of the magnetic field can be indicated. A major disadvantage of this type of gaussmeter is that it employs slip-rings which are costly, which reduce the reliability of the device and which increases frictional engagement of the various part. Further, there are (1) difficulties in obtaining a very small coil having a great number of turns, (2) difficulties in making a coil which maintains its shape while rotating very rapidly and (3) difficulties due to noise caused by the sliding contact of the slip rings.

Another type of gaussmeter is described in U.S. Pat. No. 2,757,335 issued to Bellugue. This device employs a short-circuited spherical rotor mounted for rotation about a rotation axis. The rotor comprises metallic plates electrically insulated from one another and disposed parallel to the rotation axis. Stator coils are externally mounted and magnetically coupled to the rotor, for sensing secondary magnetic fields provided by the currents induced in the rotor. This device, however, is not satisfactory since the secondary fields provided by the currents induced in the rotor, are rotating magnetic fields. With rotating magnetic fields, phase-shifts in the stator sensing coils can result in changes in position or orientation of the coils. Another disadvantage of the Bellugue device concerns its sensitivity to ambient noise fields. By mounting the stator coils externally of the rotor, the former are not only sensitive to the secondary fields, but are also sensitive to ambient noise fields. This effects the accuracy of the Bellugue device.

Accordingly, an object of the present invention is to provide an improved device for measuring the relative magnitude or detecting the direction of ambient magnetic fields.

Another object of the present invention is to provide a device (for measuring the direction of magnetic fields) having an improved signal-to-noise ratio.

Still another object of the present invention is to provide an improved compass in which the angular momentum of the compass rotor provides gyrostability with respect to pitch, roll and translation acceleration.

These and other objects are achieved by a device for determining the direction of a primary magnetic field comprising a body mounted for rotation in the primary field about a predetermined axis. The body includes means for defining at least one and preferably a plurality of electrical paths transversely to the predetermined axis. Sensing means are provided for producing a first electrical signal in response to secondary magnetic field components which are substantially at the same frequency as the rotational frequency of the rotor. Means are also provided for detecting the angular position of the body as it rotates and for providing a second electrical signal corresponding to the angular position. Means responsive to the first and second electrical signal determine the direction of the primary field.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

Throughout the various figures, the same numerals refer to like parts.

Figures 1, 3:
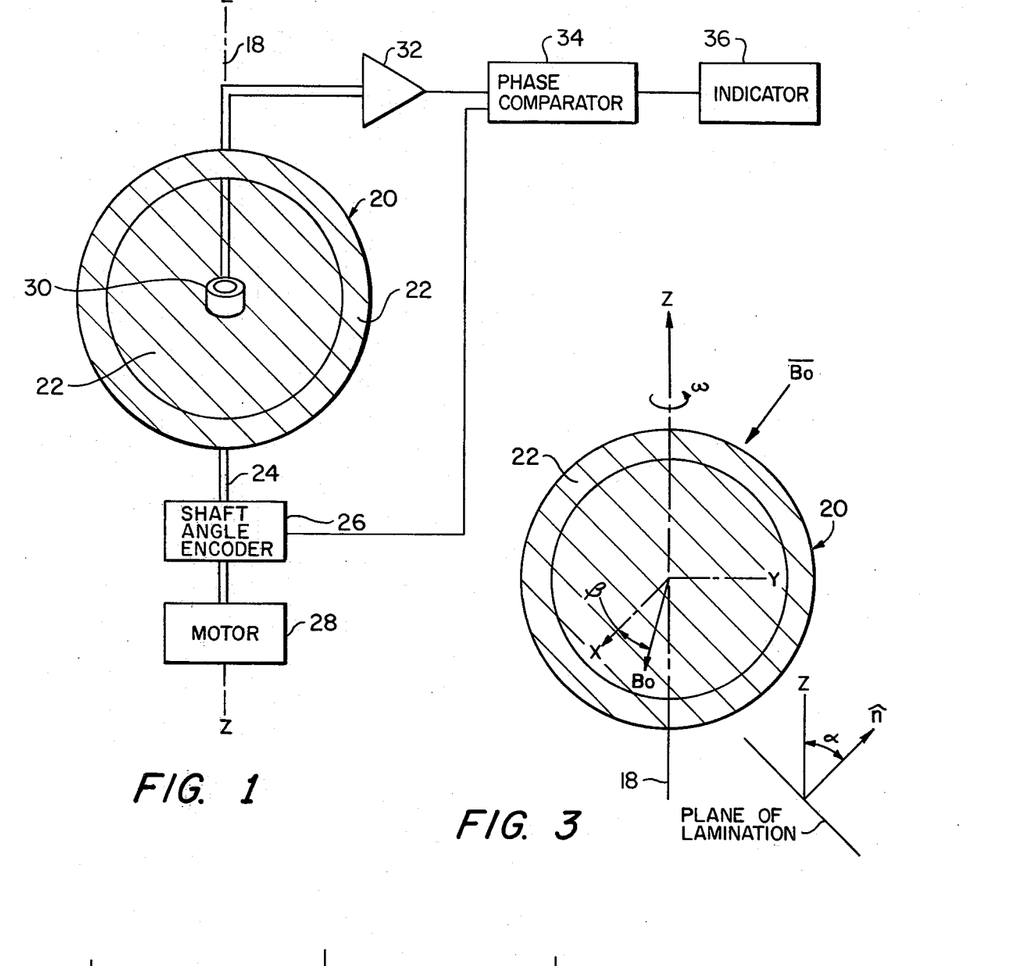
FIG. 1 is a schematic representation of the preferred embodiment of the present invention.
FIG. 3 illustrates by spatial representation, the principles of the present invention.
Figure 2A:
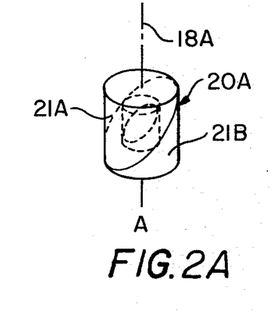
FIGS. 2A–2D illustrate alternative embodiments of the rotor of the present invention.
Figure 2B:
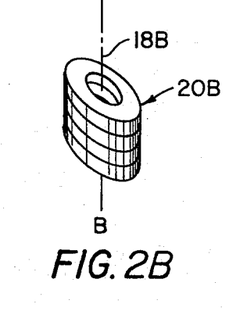
Figure 2C:
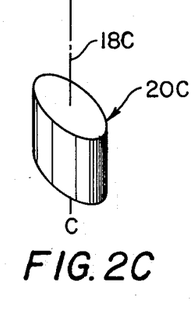
Figure 2D:
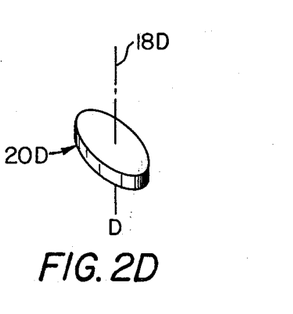

In FIG. 1, the present invention includes a rotatable body in the form of rotor 20 which includes means for defining at least one and preferably a plurality of electric paths so that when rotor 20 is rotated in certain ambient magnetic fields an electric current will be induced along said paths. Each path lies in a plane that is transversely oriented at an acute angle to Z rotation axis 18. Preferably, rotor 20 is a closed, hollow spherical body comprising a plurality of parallel, annular laminations 22, each defining a separate electric current path. The laminations are insulated from one another with a suitable insulative material as well known in the art. The laminations are made of any suitable electrically-conductive material, such as aluminum or the like. The parallel planes which are defined by the laminations of the rotor are all disposed with respect to the rotation axis 18 at an angle $\alpha$, wherein $0 < \alpha < 90$ for reasons which will become more apparent hereinafter. Although the preferred rotor 20 is shown as a closed, laminated spherical body, the rotor may be of other configurations. For example, rotor 20 may be another type of closed body of revolution such as the closed hollow cylindrical rotor 20A shown in FIG. 2A. However, rotor 20 need not be a body of revolution, but may take other forms, such as the cylinders 20B and 20C of FIGS. 2B and 2C and the disc 20D of FIG. 2D. The opposite ends of each of the cylinders 20B and 20C and disc 20D are truncated by the planes which are oriented at the angle $\alpha$ with respect to their axis of rotation. Further, the rotor need not be laminated but may be made of mating portions such as the two elements 21 and 21B of the rotor 20A or one integral element such as the rotors 20C and 20D. The mating surfaces of elements 21A and 21B lie in a plane which extends transversely at the angle $\alpha$ through the rotation axis 18.

Rotor 20 is secured to rotatable shaft 24. Means are provided for simultaneously determining the angular position of shaft 24 with respect to some angular reference position, and for providing an electrical reference signal indicative of that relative angular shaft position. This means preferably comprises either a zero reference signal or an incremental shaft encoder 26, which are well known in the art. See for example, U.S. Pat. Nos. 3,096,444, 2,187,187, 3,265,902, 3,400,275 and the references cited therein. The reference output of the encoder 26 is connected to one input of the phase comparison circuit 34.

Shaft 24 and rotor 20 are driven by motor 28. Although various types of motors may be used, the motor should not magnetically interfere with the primary or secondary magnetic fields provided by rotor 20. It is therefore preferable to use motors which provide little or no magnetic fields, such as pneumatic motors, or to enclose the motor in a magnetic shield (not shown). A secondary field sensor, such as coil 30, is preferably disposed inside rotor 20 so that it is oriented to sense all field components in a direction parallel to rotation axis 18. Although the sensor is shown as a coil, it will be appreciated that other magnetic field detectors such as Hall-effect devices could be used equally as well. The terminals of coil 30 are connected to a signal amplifier and conditioner 32, the output of the latter being connected to an input of a phase-comparison circuit 34.

Amplifier conditioner 32 filters the signal received from sensor 30 and provides at its output a signal which is preferably either in phase with its input or out of phase with the input by a fixed amount. Phase comparison circuit 34 is responsive to the output signals of amplifier 32 and encoder 26 so as to determine the direction or the relative magnitude of the primary magnetic field. Preferably, this is accomplished by measuring the phase shift relationship of some predetermined angular shaft position as indicated by encoder 26 with those frequency components of the secondary field sensed by sensor 30 which occur at a frequency equal to the rotational frequency of the rotor. The output of circuit 34 is connected to indicator 36 which may provide a measure of the phase relationship, the intensity of the magnitude of the field sensed relative to a known field magnitude, or a compass reading when the invention is used as an earth induction compass.

This phase shift relationship of the signals from encoder 26 and amplifier 32 can be better understood by referring to FIG. 3, wherein the rotor 20 is shown rotating about the Z axis 18 at an angular velocity $\omega$ rad/sec. The laminations 22 are oriented at an angle $\alpha$ with respect to the Z axis. When rotor 20 is rotated in an ambient or primary magnetic field, the latter will induce a current in the rotor along the electric current paths. This induced current will provide a secondary magnetic field within the interior of the preferred spherical rotor, the direction of which lies normal to the planes of the electric current paths or laminations 22. The directions of the secondary magnetic field, which is indicated by the unit vector, $\hat{n}$, is time dependent since the rotor is turning. If the time origin is chosen so that when $t = 0$, $\hat{n}$ lies in the x-2 plane, it can generally be shown that $$\hat{n}(t)\ t) = \sin \alpha \cos \omega t\ \hat{x} + \sin \alpha \sin \omega t\ \hat{y} + \cos \alpha\ \hat{Z} \qquad (1)$$

Since the Z component of this unit vector is not time dependent, i.e. is not a function of $\omega t$, but only a function of $\alpha$, it follows that the component of the primary incident field $B_o$ which is parallel to the rotation axis will induce no alternating current in the laminations 22. Thus, the components of the incidental field which are of interest are the X and Y components, More specifically, neglecting the Z component of the incident field, the incident field, $B_o$ may be written as:

$$\vec{B}_o = B_o (\cos \beta)\ \hat{X} + B_o (\sin \beta)\hat{Y}, \qquad 2$$

wherein:
 $B_o$ is the intensity of the primary incident magnetic field and
 $\beta$ is the angle of the primary incident magnetic field with respect to the X axis.

In order to calculate the secondary field which is induced in the interior of the rotor 20, it is necessary to consider the effective area, inductance and resistance of the rotor as well known in the art. In the preferred embodiment, calculation of the secondary field is simplified by the fact that the secondary field is uniform throughout the interior of the rotor, due to the spherical shape of the latter. It can be shown that the secondary field $\vec{B}_s$ (t) in the preferred rotor can be mathematically described as follows:

$$\vec{B}_s\ (t) = B_o \sin\alpha \cos\alpha \sin \phi \sin\ [\omega t - (\beta + \phi]\ \hat{Z}$$
$$+ B_o\ \tfrac{1}{2} \sin^2 \alpha \sin \phi\ [+\cos (\beta + \phi) - \cos (2\omega t -$$
$$(\beta + \phi))\ ]\ \hat{Y} + B_o\ \tfrac{1}{2} \sin^2\alpha \sin \phi\ [-\sin(\beta + \phi) + \sin$$
$$(2\omega\ t - [\beta + \phi](]\ \hat{X}$$

wherein
 $B_o$ = intensity of the primary incident magnetic field;
 $\phi$ = the rotor phase shift due to rotor inductance;
 $\alpha$ = the inclination of the lamination plane with respect to the Z axis;
 $\omega$ = the angular speed of the rotor; and
 $t$ = time.

From equation (3) it is readily seen that the secondary field has three frequency or time dependent components in which there is (i) a rotating field in the X-Y plane at twice the rotational frequency of the rotor; (ii) a fixed field in the X-Y plane at zero frequency; and (iii) an alternating field along the Z axis at a frequency equal to the rotational frequency of the rotor.

Thus, the combination of either frequency selection or orienting the sensor 30 in a particular direction will yield various signals of possible interest. In the present invention, the sensor 30 is adapted to detect the Z or $\omega$ frequency component of the secondary field since this component is an alternating component. This component $$B_o \sin \phi \sin\alpha \cos\alpha \sin\ [\omega t - (\beta + \phi]$$

exhibits an overall amplitude dependence of $B_o \sin \phi$. The rotor phase shift $\phi$ is a function of $\omega$, the angular speed of the rotor and $\tau$, a rotor time constant. Generally $$\sin \phi = \sqrt{\frac{(\omega\tau)^2}{1+(\omega\tau)^2}} ; \quad (4)$$

$$\cos \phi = \sqrt{\frac{1}{1+(\omega\tau)^2}} ; \quad (5)$$

In order to analyze this overall amplitude dependence, the two extreme conditions, i.e. (A) where $\omega\tau$ is small and (B) $\omega\tau$ is very large, is considered.

A. When $\omega\tau$ is small, the rotor is either moving slowly or the rotor is of a high-loss type and thus has a short time constant. For example, a twelve gram aluminum rotor rotating at an angular speed of 1500 rpm will have a small $\omega\tau$. Thus, $$\sin \phi \cong \omega\tau; \quad (6)$$

and $$\phi \cong \omega\tau \quad (7)$$

Since $\omega\tau$ is very small, a small amount of flux is being modulated and thus only a small alternating secondary field will be detected. In such a case, there is a loss of input field strength by a factor of $1/(\omega\tau)$. Although this loss may seem significant, the invention will still perform satisfactorily when used, in applications where there is a strong primary magnetic field, such at the earth's field. Since the amplitude of the earth's magnetic field is relatively large, the amplitude of the resulting alternating secondary magnetic field of the rotor, although reduced by a factor of $1/(\omega\tau)$, is sufficiently strong for the detection techniques employed. It is noted that $\beta$, the incident magnetic field direction will respect to the X axis appears with $\phi$ in the Z component of equation (3). Since $\phi = \omega\tau$ and $\omega\tau$ is relatively small, variations in $\omega\tau$ will not appreciably affect . For example, where $\omega\tau = 1/40$ and varies by $\pm 5\%$, $\phi$ will vary $\pm 0.07°$.

B. When $\omega\tau$ is large the rotor is either moving quickly or the rotor is a low loss type and thus has a long time constant. For example, a 100 gram aluminum rotor rotating at an angular speed of 2/000 rpm will have a large $\omega\tau$ or $\omega\tau \gg 1$. Since $\omega\tau$ is relatively large, referring to equation (4) it can be readily seen that:

$$\sin \phi \cong 1, \quad (8)$$

or $$\phi \cong 90° \quad (9)$$

Thus, $\phi$ will vary only slightly with changes in $\omega\tau$. As a consequence, small variations in $\omega\tau$ will not appreciably affect $\beta$. For example, it can be shown that where $\omega\tau = 40$ and varies $\pm 5\%$, $\phi$ again will only vary approximately $\pm 0.07°$. It is noted that when using the combination of a Hall-effect sensing device with permeable flux concentrators in a suitably high inductance rotor, operating at moderate to high speeds, the combination would provide a device of small size and of a zero order frequency dependency in that it would be less sensitive to ambient noise of high frequencies. Thus, some shielding requirements can be eliminated.

Referring again to equation (3) the amplitude of the Z component is also dependent on $\sin\alpha \cos\alpha$ or, $\frac{1}{2} \sin 2\alpha$. Thus, the Z component of the secondary field will have a maximum amplitude when $\alpha$ equals 45° and will be equal to zero when $\alpha = 0$ or $\alpha = 90$. Since the X and Y field components are a function of $\sin\alpha$ and the Z component is a function of $\sin 2\alpha$, when $\alpha$ equals zero, all the field components of the secondary field are zero and when $\alpha$ equals 90°, the X and Y field components are maximum and the Z component is zero. The range of angles between 0 and 90° through which $\alpha$ may be satisfactorily defined, is dependent on several factors including the amount of ambient magnetic noise which is present, the strength of the primary magnetic field and the amount of mechanical vibration of the various moving elements of the device which gives rise to errors. For example, when the invention is used to detect relatively strong ambient magnetic fields, such as the earth's field it can be shown that satisfactory results are achieved when $\alpha$ is within 5° of 0° or 90°. At such an angle, $\sin 2\alpha = 0.17365$. Thus, although the amplitude of the secondary field is reduced to 0.17365 of the amplitude of the primary field, the amplitude of the secondary field is sufficiently strong under normal conditions for detection purposes.

Referring again to FIG. 1, since $\beta$ is substantially a fixed value and $\phi$, which is fixed, is of a negligible effect, by comparing the $(\omega t - \beta)$ signal provided by sensor 30 with the $\omega t$ signal provided by the encoder 26, the angle that the primary incident field makes with the X axis becomes the phase difference between the two alternating signals. This phase difference $\beta$, can be determined by phase comparison circuit 34.

Figure 4:
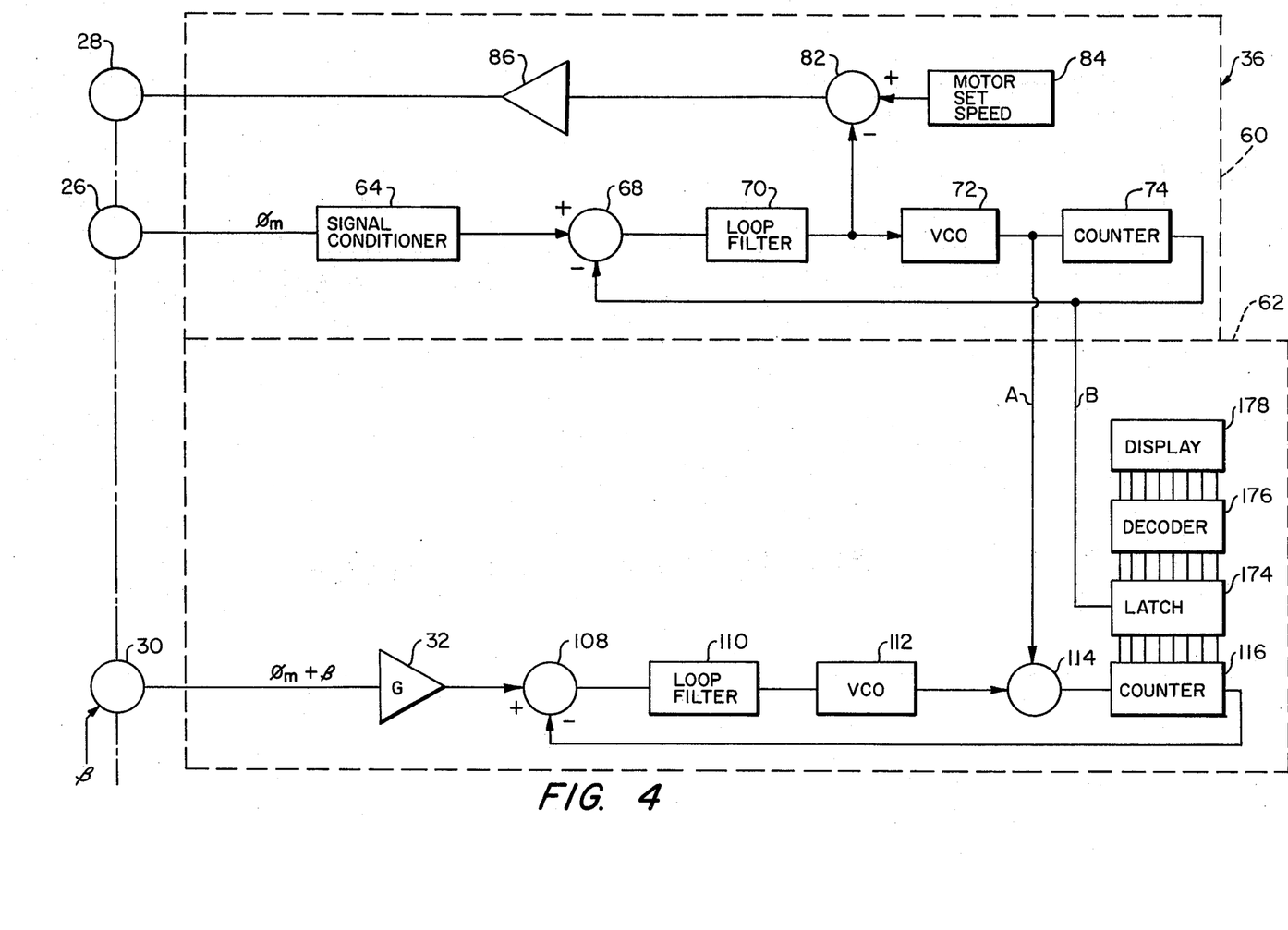
FIG. 4 is a block diagram of the preferred embodiment.
Figure 5A:
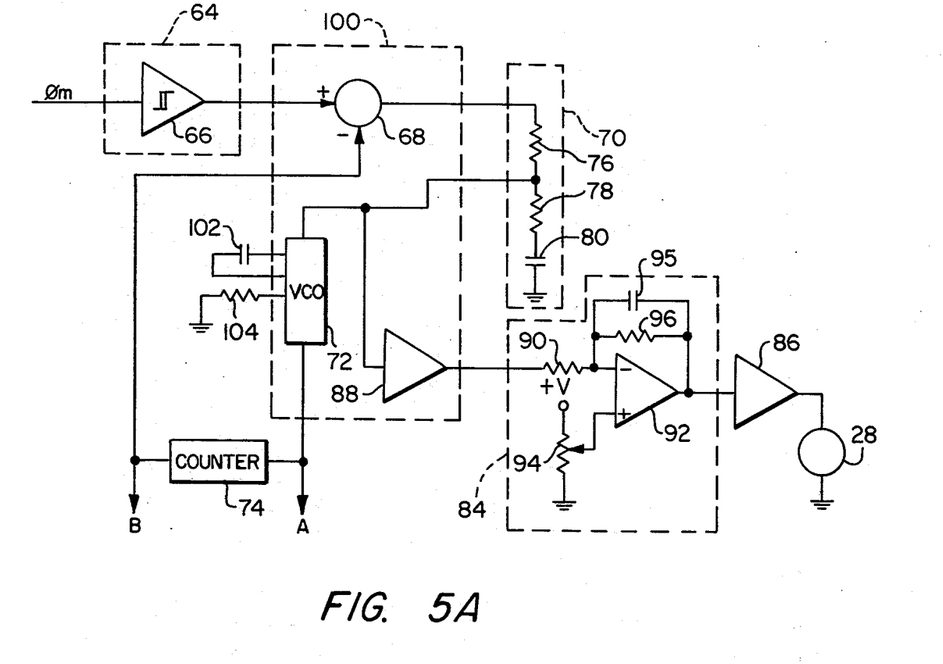
FIGS. 5A–5D illustrate in greater detail, block diagrams of the FIG. 4 embodiment.
Figure 5B:
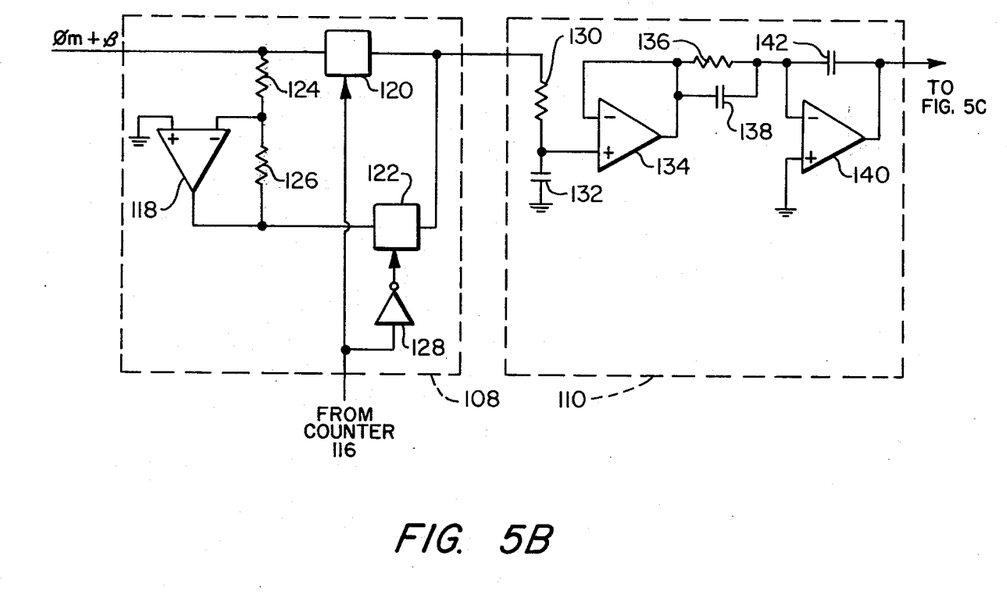
Figure 5C:
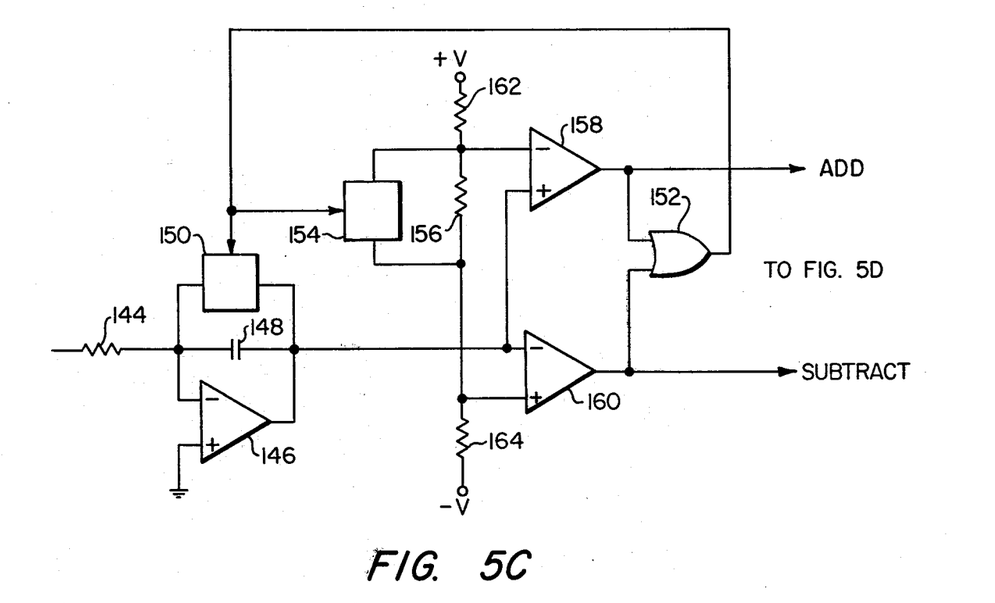
Figure 5D:
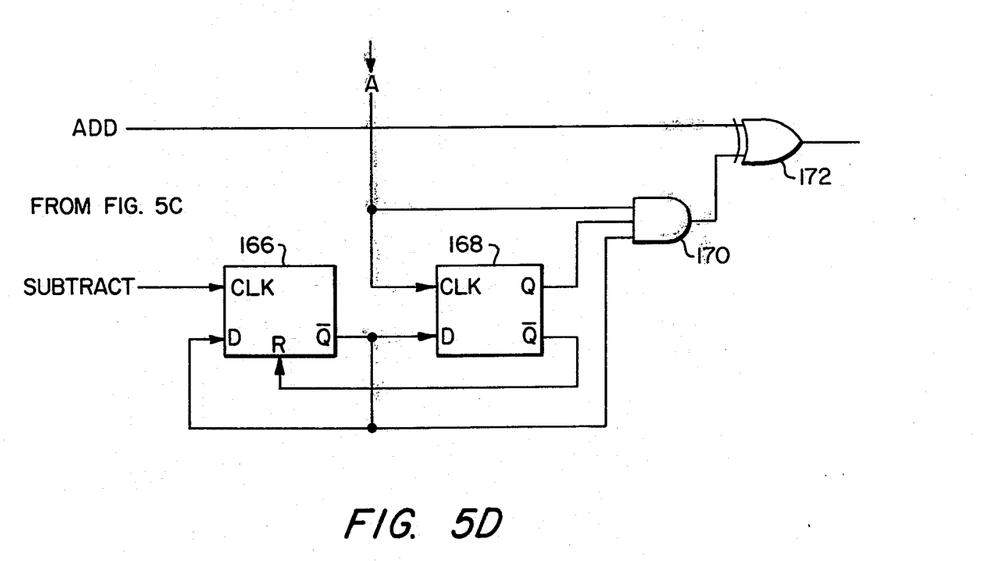

Referring to FIGS. 4 and 5A-D, a phase comparison circuit which can be used with the present invention is shown in detail as comprising a master section 60 and a slave section 62. Master section 60 which is shown generally in FIG. 4 and more specifically in FIG. 5A, controls the angular speed of motor 28 and creates a reference frequency which is 360 times the rotational frequency of the motor as sensed by encoder 26. More specifically, encoder 26 provides a periodic signal which preferably is a train of pulses the pulse repetition rate of which defines the reference frequency and therefore defines the total angular displacement of the rotor $\phi_m$. Since the rotation of the rotor is unidirectional, $\phi_m$ is constantly increasing and is equal to $\omega\tau$ where $\omega$ is the angular speed of the rotor. For purposes of illustration hereinafter $\phi_m$ will be considered to be initially zero when the signal from encoder 26 makes a positive transition. Thus, the output signal from the preferred encoder 26 will be a train of pulses, in which the leading edge or positive transition of each pulse marks the instant when the rotor passes through the zero angle reference position. The output of encoder 26 is connected to the input of signal conditioner 64. The latter may be any type of device known in the art, such as Schmitt trigger 66, which shapes the input signal to provide a single pulse at its output for each revolution of the rotor. This output signal will have the same frequency and be in phase with the input signal. Thus, the output of conditioner 64 will remain a function of $\phi_m$. The output of conditioner 64 is connected to the positive input of edge phase comparator 68. Comparator 68 forms a summing junction for a servo-loop comprising loop filter 70, voltage control oscillator (VCO) 72 and counter 74. To complete the servo-loop the output of counter 74 is connected to the negative input of comparator 68. Comparator 68 provides a three state output. More specifically, the output acts as a current source for periods of negative phase errors, as a current sink for periods of positive phase errors and as an open circuit for periods of coincidence. Such comparator circuits are well known in the art, for example, see ICAN-6101 published by RCA, 19 73. The output of comparator 68 is connected to the input of loop filter 70. The latter generally includes the circuit parameters of the servoloop. Referring to FIG. 5A, filter 70 includes a low pass filter comprising resistors 76, 78 and capacitor 80. The output of comparator 68 is connected through resistor 76 to the output of the filter, while the output of the filter is connected to ground through resistor 78 and capacitor 80. In FIG. 4, the output of filter 70 is also connected to the input of VCO 72 as well as the negative input of summing junction 82. The positive input of junction 82 is connected to a voltage setting circuit 84, the latter setting the speed of the motor 28. The output of junction 82 is fed to motor driver amplifier 86 which in turn operates motor 28. Referring again to FIG. 5A, the output of filter 70 is connected through buffer 88 to the input of circuit 84. The input of circuit 84 is connected to resistor 90 which in turn is connected to the negative input terminal of speed regulating amplifier 92. The positive input of amplifier 92 is connected to a positive DC voltage potential through variable resistor or potentiometer 94. The output of amplifier 92 is connected to its negative input through the feedback capacitor 95, as well as through feedback resistor 96, the former being connected in parallel with the latter. As well known in the art, the speed of motor 28 can be set by adjusting the resistance of resistor 94.

The output of filter 70 is also connected to the input of VCO 72. The latter provides a square wave output signal A, the frequency of which in the steady state condition is 360 times the frequency of the output signal of encoder 26. Thus, a pulse will be provided for each degree of rotation of shaft 24. As shown in FIG. 5A, comparator 68, VCO 72, and buffer 88 are all commercially available as a single integrated circuit 100, which may be purchased from RCA Corp. of New York as Phase Locked Loop Integrated Circuit 4046. Accordingly as well known in the art, parameter setting components including capacitor 102 and resistor 104 are provided at the appropriate inputs of circuit 100. The output of VCO 72 is connected to the input of counter 74.

Counters are well known in the art and thus counter 74 will not be explained in great detail. Preferably counter 74 counts from 0 to 359. The counting state of the counter increases by one increment each time a pulse is provided at its input. When the counter reaches the 359 state and is incremented, the state of the counter becomes 0. The output of the counter is a high logic signal when the state of the counter is 0 to 179, inclusive, and a low logic signal when the state of the counter is 180 to 359, inclusive. Thus, a positive transition occurs at the output of counter 74 when the state of the latter changes from 359 to 0. The output B of counter 74 is connected to the negative input of comparator 68 as previously described, which compares the phase of the signals received from encoder 26 and the output of counter 74. As will be shown below, the action of the servoloop thus formed by phase comparator 68, loop filter 70, VCO 72 and counter 74 is such that the positive transition of the output of counter 74, B will be made to coincide with the positive transition of the signal from the shaft angle encoder 26 which in turn corresponds to the moment when the shaft 24 is at the zero degree reference position. The frequency of the output of counter 74 is thus made equal to the rotational frequency of the shaft. Consequently, the output of VCO 72 which is equal to the input of counter 74 has a frequency of 360 times the rotational frequency of the motor. Both the output A of VCO 72 and output B of counter 74 are connected to slave section 62 in a manner to be described hereinafter.

Referring to FIG. 4, slave section 62 receives its signal from the rotor sensor 30, the latter providing a signal as previously described. This signal will have a phase if $\phi_m + \beta$. The input of slave section 62 is connected to the input of amplifier 32. The output of the amplifier 32 is connected to the signal input of mixer 108. The latter forms a junction for a servoloop. The latter comprises loop filter 110, VCO 112, correction logic 114 and counter 116. The output of counter 116 is connected to the feedback input of mixer 108 so that the latter provides at its output a signal in phase with its input signal and corresponds to the phase difference between the input signal and the feedback signal. Mixer 108 as shown in greater detail in FIG. 5B, comprises an inverting amplifier 118 and transmission gates or switches 120 and 122. The input of mixer 108 is connected to the signal input of gate 120 and through resistor 124 to the negative input of inverter 118. The output of amplifier 118 is connected to both its negative input through feedback resistor 126 and to the signal input of gate 122. The control input of gate 120 is connected directly to the output of counter 116 while the control input of gate 122 is connected to the output of counter 116 through inverter 128. Gates 120 and 122 are of a type well known in the art. Generally, each operates as a closed switch between its signal input and output when the signal applied to its control input is of a high logic state. Conversely, each gate will act as an open switch between its signal input and its output when the signal applied to its control input is of a low logic state. The output of both gates 120 and 122 are connected together and to the output of mixer 108. The output of mixer 108 is connected to the input of loop filter 110. Loop filter 110 which includes the circuit parameters of the servoloop is shown in greater detail in FIG. 5 B. The input of filter 110 is connected to a low pass RC filter. The latter comprises resistor 130 which is connected to ground through capacitor 132. As well known in the art, the RC filter will filter out higher order harmonics while passing a DC signal. The junction of resistor 130 and capacitor 132 is connected to the positive input of voltage follower 134. Both resistor 136 and capacitor 138 are connected to the negative input of the integrator 140 which has a positive input connected to ground and its output connected through capacitor 142 to its negative input. Aa well known in the art, voltage follower 134 functions primarily as a buffer between the input of loop filter 110 and integrator 140, and capacitor 138 provides lead information to the servoloop in order to provide loop stability. Integrator 140 will invert and integrate the input signal appearing at its negative input through capacitor 142.

Referring again to FIG. 3, the output of filter 110 is connected to the input of VCO 112. The latter, which is shown in greater detail in FIG. 5C, generally provides an output signal which is a pulse train, the pulse repetition rate of which is proportional to the amplitude of its input. VCO 112 generally comprises an integrator 146, transmission gates 150 and 154, voltage comparators 158 and 160 and OR gate 152. The input of VCO 112 is provided with resistor 144 which is connected to the negative input of integrator 146. The positive input of integrator 146 is connected to ground while its output is connected to its negative input through capacitor 148. As well known in the art, a signal received at the negative input of integrator 146 will be integrated through resistors 144 and capacitor 148. The output of integrator 146 is also connected to its negative input through transmission gate 150 across capacitor 148. The control input of gate 150 is connected to the output of OR gate 152, so that when gate 150 receives a high logic signal at its control input, gate 150 acts as a closed switch in order to clear capacitor 148, and when a low logic signal is received at its control input, gate 150 functions as an open switch, to allow capacitor 148 to store the output of integrator 146. The output of integrator 146 is connected to the positive input of comparator 158 and to the negative input of comparator 160. The negative input of comparator 158 is connected through resistor 162 to a positive DC voltage bias and through resistor 156 to the positive input of comparator 160. The positive input of comparator 160 is also connected to a negative DC biasing potential through resistor 164. Comparators are well known in the art. When the potential at the positive input is greater than the potential at the negative input, the output is a high logic signal. When the potential at its negative input is greater than the potential at its positive input, the output of the comparator is a low logic signal. The outputs of both comparators 158 and 160 are connected to the input of OR gate 152. OR gates are well known in the art and thus gate 152 is not described in detail. Generally, gate 152 will provide a high logic signal when either or both of its inputs is a high logic signal, and will provide a low logic output signal when both of its input signals are low. The output of gate 152 is connected to the control inputs of transmission gates 150 and 154. Transmission gate 154 is connected across resistor 156 to the negative input of comparator 158 and the positive input of comparator 160. A short circuit is thus provided between the negative input of comparator 158 and the positive input of comparator 160 when a high logic signal is received at the control input of gate 154 so that the voltage potential at both inputs decreases to some small predetermined value. Thus the output of OR gate 152 will remain high thereby clearing the capacitor 148 through transmission gate 150 until the output of integrator 146 is reduced to this small predetermined value. When a low logic signal is received at the control input of gate 154, then the latter acts as an open switch, leaving resistor 156 in the circuit to provide a voltage difference between the negative input of comparator 158 and the positive input of comparator 160. The outputs of comparators 158 and 160 are also connected to correction logic 114, shown generally in FIG. 4 and more specifically in FIG. 5D. The output of comparator 160 is connected to the clocking input of D-flip flop 166. The $\overline{Q}$ input of the flip flop is connected to the D-input of D-flip flop 168, to an input of AND gate 170 and to its own D input. The $\overline{Q}$ output of D-flip flop 168 is connected to the reset input of flip flop 166. The Q output of flip flop 168 is connected to an input of AND gate 170. The clocking input of 168 is connected to the output A of VCO 72 of the master section 60. D-flip flops 166 and 168 are of a type well known in the art. Generally, when a clocking pulse is received at its clocking input the logic state of the D input of the flip flop will appear at its Q output and the logic inverse of its D input appears at its $\overline{Q}$ output. The output A of VCO 72 is also connected to an input of AND gate 170. AND gate 170 is of a type well known in the art and generally provides a high logic output when all of its inputs are of a logic high state, and will provide a low logic output when any one or all of its inputs is of a low logic state. The output of AND gate 170 as well as the output of comparator 158 is connected to the input of exclusive OR gate 172. The latter is also well known in the art and will generally provide a high logic output when either input is high, but will provide a low logic output when both outputs are low or both inputs are high. The output of exclusive OR gate 172 or correction logic 114 is connected to the input of counter 116. The output of the latter is connected to transmission gates 120 and 122 of mixer 108 as previously described. Counter 116 operates in a similar manner as counter 74. In particular, the output of counter 116 provides a high logic signal when the state of the counter is zero to 179, inclusive, and a low logic signal when the state of the counter is 180 to 359 inclusive. Thus, a positive transition occurs at the output of counter 116 when the state of the counter changes from 359 to zero.

As will be evident hereinafter, when the master and slave loops are in equilibrium and the count in counter 74 is zero, the count in counter 116 will be 90° + $\beta$. Accordingly, a signal output of counter 116 which is indicative of the present count of the counter is connected to latch 174. The latter is strobed or clocked by the output of counter 74 of the master section 60. Latch 174 is well known in the art and may, for example, be any type of sample and hold circuit which will sample the signal which is representative of the present state of the counter 116 when it is strobed by a positive transition from the output of counter 74. The output of latch 174 is connected to the decoder driver 176 which will in turn drive display 178. The latter indicates the state of counter 116 when the latter is clocked into latch 174.

The operation of the device illustrated in FIGS. 4 and 5A-D will now be described. Motor 28 is operated so that rotor 20 is rotated about its z axis. The rotor is subjected to a primary incident magnetic field, the latter being directed at an angle $\beta$, with respect to the zero reference angle. As previously described, the rotor thus modulates the primary field to provide a secondary alternating magnetic field at the same frequency as the rotational frequency of the rotor and at a phase angle directly dependent on the direction, $\beta$, of the incident field. Although other phase shifts may enter into defining this secondary field and any electrical signals derived therefrom, as well known in the art these phase shifts are all fixed and can be accounted for by adding or subtracting a fixed number to the final reading. Thus, ignoring these fixed phase shifts, the signal from shaft encoder 26 is amplified and shaped to provide a pulse signal 202 (see FIG. 6A), in which the leading edge of each pulse occurs when shaft 24 passes through the zero angle reference and the signal has a total angular displacement angle $\phi m$. At the same time, the signal from rotor sensor 30 is shaped and amplified by amplifier 32 to provide a sine wave signal 204 (see FIG. 6B) of the same frequency as the signal 202 from encoder 26, but differing in phase with signal 202 by $\beta$, the angle of the incident magnetic field with respect to the preselected zero angle reference position of shaft 24. The leading edge of each pulse of signal 202 is compared with the leading edge of each cycle of the square wave provided by the output of signal B (see FIG. 6C) of counter 74. As well known, if the speed of motor 28 is constant, the leading edges of signals 202 and B will be coincident and no correction signal will be provided by comparator 68. If, however, the speed of motor 28 increases or decreases, or if the frequency of the output of VCO 72 has increased or decreased the output of comparator 68 is modified by a change in phase between the incoming signal from encoder 26 and the output signal B of counter 74. As a result comparator 68 provides a DC error signal to the buffer 88 through low pass filter 70. This error signal changes the output of amplifier 92 to change the input to amplifier 86 which in turn corrects the speed of motor 28 to eliminate the error.

The output of comparator 68 is also passed through filter 70 to the input of VCO 72. The parameters of the components 102 and 104 and the value of capacitor 95 are such that VCO 72 is much more rapidly responsive to the error signal than speed regulating amplifier 84. When there is no error in rotor speed, VCO 72 is corrected to bring the positive transistion of signal B back into coincidence with the positive transition of signal 202. Further, under steady state conditions, the output signal (see FIG. 5D) of VCO 72 is at a frequency which is 360 times the frequency of the output signal of counter 74. Since the frequency of the output of counter 74 is made equal to the rotational frequency of the rotor, signal A will provide one positive pulse for each degree of rotation. The output signal A is applied to AND gate 170, the clocking input of flip flop 168 of correction logic 114 and to the input of counter 74. The latter provides a square wave output signal which is 1/360th the frequency of the output signal of VCO 72. The output signal of counter 74 strobes or clockes the signal of the present state of counter 116 into latch 174.

When the system is in the steady state condition, i.e. the direction of the primary incident field remains fixed, the correct reading of $\beta$ plus a fixed phase shift of 90° (for reasons which will be more evident hereinafter) will appear on display 178. The value appearing on display 178 will hereinafter be referred to as $\delta$. Thus, the signal from sensor 30 is amplified and shaped by amplifier 32 and applied to the input of mixer 108. Since the system is in the steady state condition, no error signal is provided by mixer 108 and the correction logic 114 is in an inactive condition so that no error pulses are provided. Thus, the output of VCO 72 signal A, passes through the logic 114 unmodified. Since signal A is at a pulse repetition rate which is 360 times that of signal B, the counter 116 receives exactly 360 pulses, between each positive transition of signal B and thus, each time the counter state is sampled by latch 174. Since counter 116 has exactly 360 counting states, it will be in the same state each time it is sampled by latch 174. For example, if the counter is in the state "050", (indicating $\beta = 320°$) when sampled it will remain in this state each time it is sampled. The output of counter 116, signal C (shown in FIG. 6E) as previously described, is a square wave which is at a frequency equal to the frequency of the motor rotational speed. Signal C is advanced in phase with respect to signal B by the number of degrees equal to the value provided on display 178. Thus, in the example above signal C will be advance by 50° with respect to the motor rotation frequency. Signal C is combined with amplifier signal 204 (FIG. 6B) from sensor 30 in mixer 108. Signal C will be high when $\phi m = -50°$ to $+129°$, inclusive and low for $\phi = 130°$ to $309°$ inclusive as shown in FIG. 6E.

The output of mixer 108 is next fed into loop filter 110, where resistor 130 and capacitor 132 filter out the fluctuating components and yield a voltage input to buffer 134 which is equal to the average value of this signal. When steady state conditions exist the output of counter 116 is in quadrature with the incoming signal from sensor 30 and thus as well known in the art, the average value will be zero.

Figure 6:
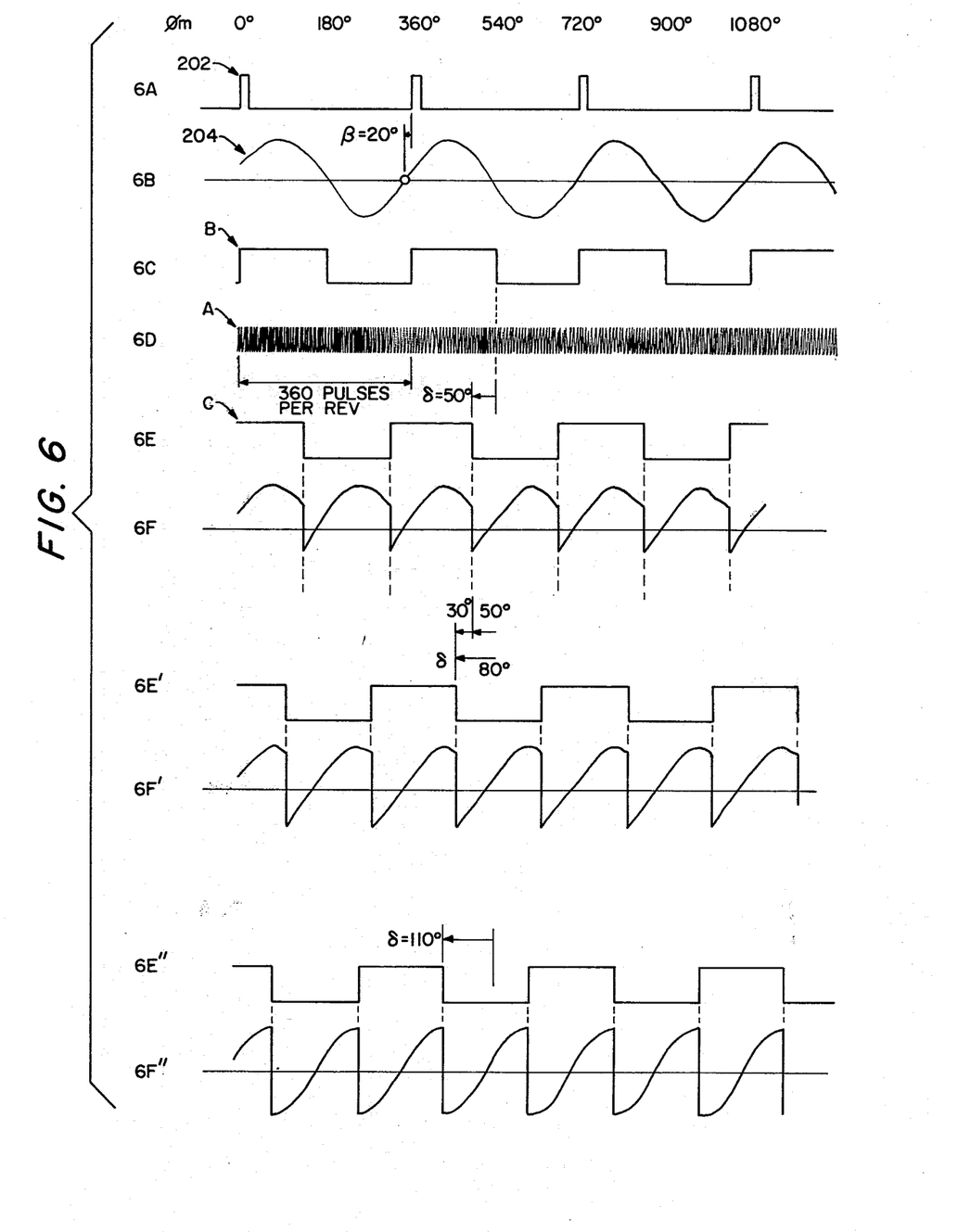
FIG. 6 is a graphical diagram on a common time base which facilitates an understanding of the operation of the FIG. 4 embodiment.

If B now changes from 320° to +20°, (as shown in FIG. 6B), the average value of the voltage input to buffer 134 will become positive as shown in FIG. 6F. This input is inverted by buffer 134 and integrated by integrator 140 to provide a negative output signal whose magnitude is proportional to the amount of change in $\beta$. The output of integrator 140 is fed into VCO 112. The output of integrator 146 causes the potential at the positive input terminal of comparator 158 to increase until it exceeds the potential at the negative input terminal. When this occurs the output of comparator 158 goes from a low logic state to a high state, enabling OR gate 152. This will cause the output of gate 152 to go high and thereby close switches 150 and 154. When switches 150 and 154 are closed, capacitors 148 and resistor 156 will short. This results in the output of integrator 146 to go to zero, the potential at the positive input terminal of comparator 158 to go below the potential at the negative input terminal and thus the output of comparator 158 to go low. The output of comparator 158 is thus a pulse.

This process repeats as long as the input to VCO 112 is negative. The rate of pulse repetition is proportional to the magnitude of this voltage.

Figure 7:
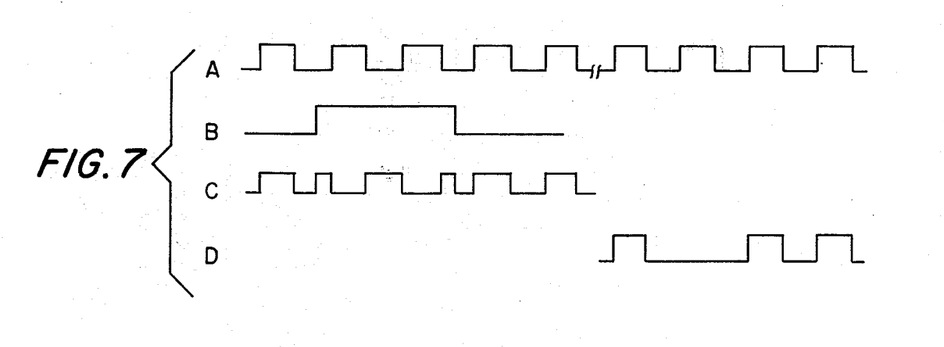
FIG. 7 is another graphical diagram on a common time base which facilitates an understanding of the operation of the FIG. 4 embodiment.

The effect of each pulse on correction logic 114 is shown in FIG. 7. As will be more evident hereinafter, the Q output of flip flop 166 and the $\overline{Q}$ output of flip flop 168 are both initially high. Thus, each time a pulse of the input A of VCO 72 shown in FIG. 7A, is provided to AND gate 170, the latter will be enabled for the duration of the pulse. The gate will provide a like pulse at its output which is applied to the input of exclusive OR gate 172. When a pulse 216 (see FIG. 7B) is applied to exclusive OR gate 172, signal A will be inverted twice, and thus have the effect of adding a pulse to the output of gate 172. (See FIG. 7C.)

In the example above, where $\beta$ has changed from 320° to 20°, counter 116 was in an initial state "050" when first sampled. After thirty such pulses have been applied to the output of gate 172, counter 116 will be in the state "080" when sampled by latch 174. Thus, the display will change to read 080. Furthermore, the output signal C of counter 116 will be advanced an additional 30°, for a total phase advanced 80° relative to reference square wave B. This new situation is illustrated in FIG. 6E' and 6F' where 5E' shows the modified signal C, and 6F' shows the resultant output of mixer 108. It will be noted that the average of this signal is less than originally shown in FIG. 6F.

The positive error signal in the output of mixer 108 acting through loop filter 110, VCO 112 and correction logic 114 will continue to advance the phase of the signal C so as to reduce the error signal in the output of mixer 108. When this error signal reaches zero, corrections are stopped, and $\delta$ will be 110° corresponding to the value of 20° for $\beta$. The situation is illustrated then by FIG. 6E" and 6F".

Now if the direction of the incident field of changes from 20° to, for example, −20°, the output of mixer 108 will have a negative average value. Now, in a manner similar to the previous example, this causes a negative voltage to be applied to the input of buffer 134. The output of buffer 134 is inverted and integrated by integrator 140 to provide a positive output signal whose magnitude is proportional to the amount of change in β. This signal is fed into the VCO 112.

The output of integrator 140 this time causes the potential at the negative input terminal of comparator 160 to decrease below the potential at the positive input terminal of comparator 160. The output of the comparator 160 thus goes high enabling gate 152, the output of which closes switches 150 and 154. In this way, a pulse is provided at the output of comparator 160. This process will continue so long as the input to the VCO 112 is positive. The rate at which the pulses occur is proportional to the magnitude of this signal. Each of these pulses will clock flip flop 166. When the latter is clocked, since the initial state of the Q output of flip flop 166 is high, the input signal to the D input of the flip flop is high. Thus, when the flip flop is clocked, $\overline{Q}$ will go low causing the D input of flip flop 168 to go low. Accordingly, when the next clocking pulse of signal A to the flip flop 168 is received, the Q output of flip flop 168 will go low and the $\overline{Q}$ output will go high. This resets flip flop 166 so that the Q output of the latter flip flop is high. The low Q output of flip flop 168 will disable gage 170 so that the output of the latter will go low. Thus gate 172 is disable for the duration of one pulse of signal A as shown in FIG. 7D. The next pulse of signal A to the clocking input of flip flop 168 will clock in a high input causing the Q output of flip flop 168 to go high thereby enabling gate 170 again. Gate 172 each time it is pulsed by signal A will again be enabled so that a pulse is provided at its output. This results in one pulse being eliminated at the input of counter 116.

The result of each of these pulses is to decrease the value of the display by one for each pulse, and to delay the signal C by 1°. In the example given, after 40 pulses have been deleted, the display will be reduced from 110 to 70. When the average error reaches zero, the input to VCO 112 will become zero. The action of the correction logic 114 will cease, and the display δ will cease to change.

In summary, the action of slave loop 62 is such that the value of the display, 8 will be adjusted so that δ = β+90, where β is the direction of the incident magnetic field. The fixed displacement of 90° can be allowed for by simply changing the definition of the zero angle reference axis from which all angles are measured.

Although the operation of this circuit has been described in terms of its sequential operation, it can also be analyzed in terms of open and closed loop system functions. This is well known in the art, and provides the criteria for parameter selection in terms of the desired frequency response of the circuit.

Although the invention has been described with reference to the preferred embodiment, various modifications can be made without departing from the invention.

Figure 8:
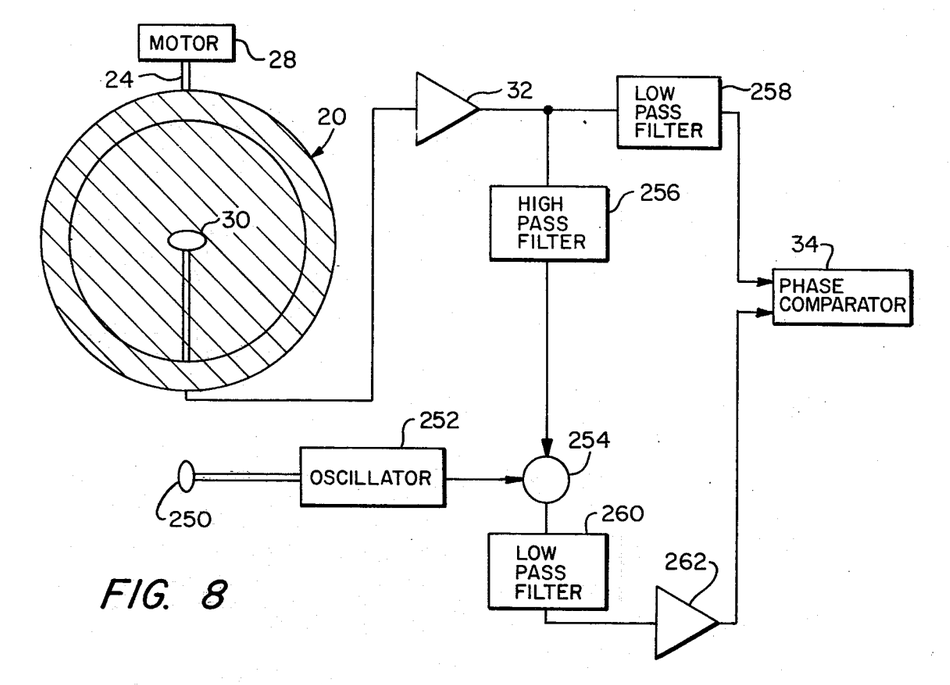
FIG. 8 shows a partially schematic illustration of an alternative embodiment of the present invention.

In the alternative arrangement of FIG. 8, the encoder 26 is eliminated and another arrangement is utilized for providing the reference signal to the circuit 34. This arrangement includes the use of a small signal generating coil 250 positioned in the vicinity of and externally the rotor 20 so that the longitudinal axis of the coil is approximately perpendicular to the axis 18. In this way, the primary field provided by current in this coil has no Z component. Coil 250 is driven by oscillator 252. The latter should be a source of current having a frequency much higher, e.g., five times greater than the angular speed of the rotor. Such oscillators are well known in the art and thus will not be explained in great detail. For example, an oscillator providing a 10 KHz output would be sufficient for a rotor moving at an angular speed of 2,000 rpm. The output of oscillator 252 is also connected to one input of multiplier 254. Multipliers are well known in the art and thus will not be explained in great detail. Generally, multiplier 254 is the type which has as its signal output, the product of two signal inputs. The other input of multiplier 254 is provided from the output of amplifier 0.32 through the high pass filter 256. High pass filters are well known in the art and thus will not be explained in great detail. Generally, high pass filter 256 will pass electrical signals which are of the same frequency as the frequency of the reference signal provided by oscillator 252 and will block both signals of the frequency determined by the angular speed of the rotor. The output of amplifier 32 is also connected to one input of circuit 34 through low pass filter 258, while the output of multiplier 254 is connected to low pass filter 260. Both filters 258 and 260 will pass signals of a frequency equal to the frequency determined by the angular speed of the rotor 20, while blocking those signals of a frequency equal to the frequency of the reference signal of oscilator 252. The output of low pass filter 260 is connected to the direct input of comparator 262. The reference input of the comparator is connected to ground. The output of comparator 262 is connected to the second input of circuit 34.

In operation, oscillator 252 is driven at the prescribed operating reference frequency, $\omega_c$ and thus the exciting signal I(t) may be expressed as follows:

$$I(t) = A \cos \omega_c t, \quad (10)$$

wherein A is a constant.

Neglecting various constant phase shifts, the reference secondary field Bc(t), which results from this exciting signal and which is sensed by coil 30 can be expressed as follows:

$$B_c(t) = KA \cos \omega_c t \sin \omega t, \quad (11)$$

wherein
K is a constant; and
ω is the angular speed of the rotor relative to some reference direction.

Figure 9:
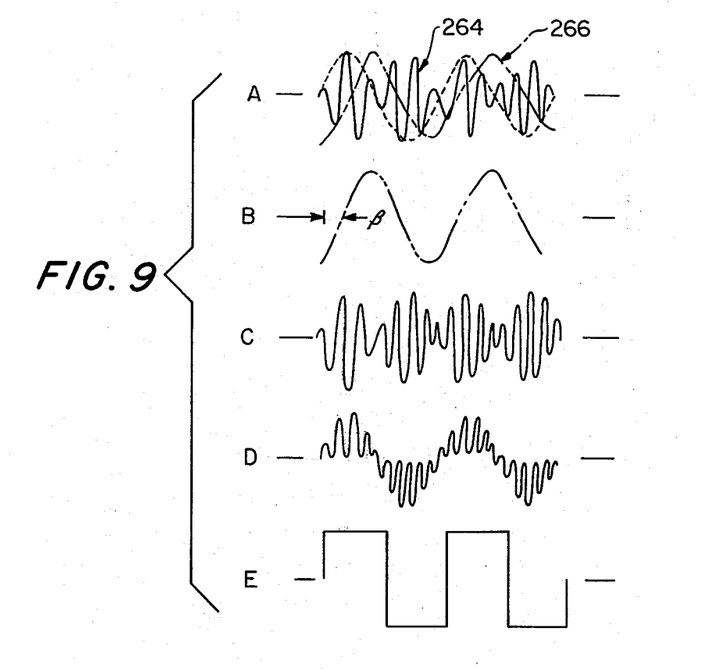
FIG. 9 shows a graphical diagram on a common time base for facilitating an understanding of the FIG. 8 embodiment.

The secondary field and thus the current induced in coil 30 as a result of the presence of this field is a modulated signal, the carrier frequency of which is $\omega_c$ and the envelope frequency is ω When a primary magnetic field $B_o$ is present, the current induced in coil 30 will also have the ωt-β component as described above. Thus, referring to FIG. 9A ignoring constant phase shifts, the output of the amplifier 32 will have a high frequency component 264 and a low frequency component 266. Only the low frequency component will pass through the filter 258, (the output of which is shown in FIG. 9B) and is applied to the signal input of phase comparison circuit 34. High pass filter 256 passes only the high frequency component illustrated in FIG. 9C. This modulated signal when multiplied by the signal from oscillator 252 becomes $$I(t) = KA \cos^2\omega_c t \sin \omega t \qquad (12)$$

This output is illustrated in FIG. 9D. This signal when passed through the low pass filter 260 will have the highest frequency components removed yielding a DC signal which in turn is applied to the direct input of comparator 262. At each crossing of the zero axis of the signal at the direct input of comparator, the output of the latter goes from a positive DC potential to a negative potential and then at the next zero-axis crossing a negative DC potential to a positive DC potential as illustrated in FIG. 9E. This output of comparator 262 thus provides the reference signal to the reference input comparator circuit 34.

The invention thus described may be used to determined the direction or the relative magnitude of any ambient magnetic field. The invention is therefore particularly useful as a compass. As well known in the art, when a compass is supported on a moving, rolling, pitching platform, any deviation from the vertical will introduce errors in the compass reading. In temporate latitudes this error is typically 3° per degree tilt, and is even worse in the polar regions. These errors are usually reduced by mounting the device on a set of gimbals and introducing an amount of pendulosity so that the platform tends to seek a level position. The residual platform error for such arrangements is of a dynamic nature due to transient acceleration inputs. If such a platform is highly damped to attenuate its response to these transients, then its response to pitch and roll becomes poor. Since the present invention has all the aspects of a vertical gyroscope it can easily be mounted in a vertical gyro gimbal erection system in a manner well known to those skilled in the art. For example, referring to FIG. 10, the entire magnetic field sensing system including rotor 20 is mounted in gimbal system 350 in a well known manner so that the rotor will rotate about vertical axis 18. The entire gimbal system 350 is mounted on the base 352 in a manner well known to those skilled in the art. Typically, gimbal system 350 includes an inner gimbal mount 354 and an outer gimbal mount 356. The magnetic field sensing system is pivotally mounted on inner gimbal mount 354 about axis 358 which in turn is pivotally mounted to the outer gimbal mount 356 about an axis 360. As well known in the art, the gimbal mounts allow the gyro spin axis 18 to assume any direction. However, since the rotor acquires a large angular momentum along axis 18, the axis will maintain its direction independently of pitch, roll and acceleration of the system.

Figure 10:
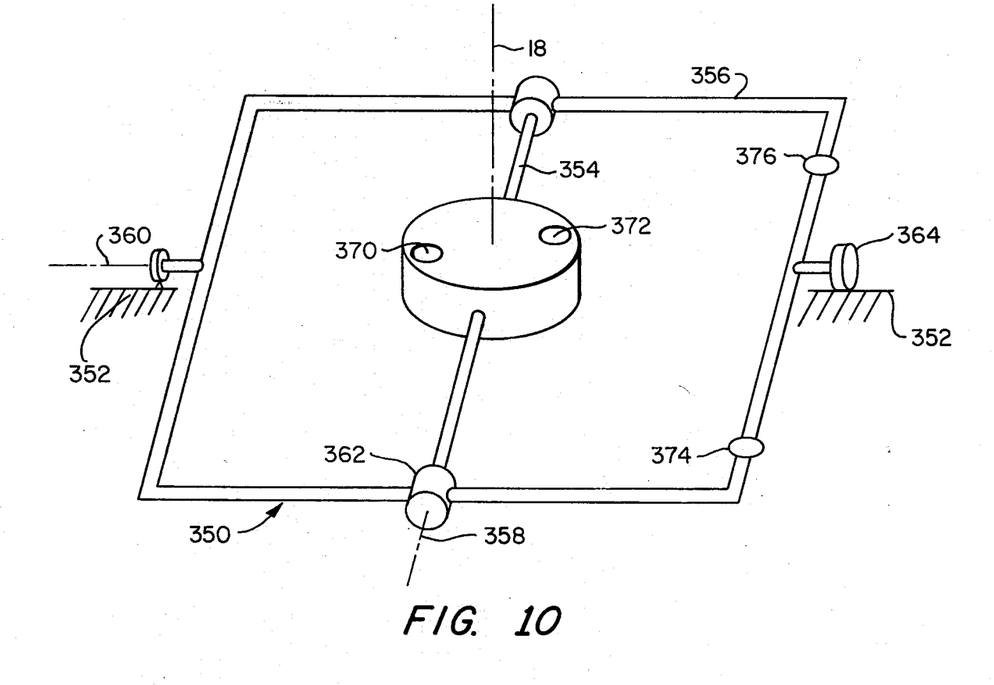
FIG. 10 illustrates a compass system for employing the present invention.

As well known in the gyroscope art, factors will cause the spin axis to slowly drift from the vertical direction. Accordingly, both gimbal mounts 354 and 356 are attached to torque motors 362 and 364, respectively so that the latter can apply small torques along the respective axis 358 and 360. A torque input along the axis 360 will cause the axis 18 to rotate about axis 358. Similarly, a torque along the axis 358 will cause the spin axis 18 to rotate about axis 360. The rate at which these correcting rotations occur is called the erection rate. Thus, torque motors 362 and 364 provide means to control the direction of spin axis 18 to eliminate result of these relatively slowly occurring errors. The means to control the torque motors is provided by gravity sensitive switches 370, 372, 374 and 376, which may for example, be mercury switches. Switches 370 and 372 respectively cause torque motor 362 to apply a clockwise or counterclockwise torque as required, while switches 374 and 376 cause torque motor 362 to apply a clockwise or counterclockwise torque as required. Any momentary acceleration will cause the switches to respond randomly, but because the erection rate response is relatively slow with respect to the duration of these accelerations, these random responses will average out. However, if the spin axis 18 is inclined from the vertical, then a continual torque will be applied until the vertical orientation of axis 18 is achieved. Rotor axis 18 is thus maintained in a vertical direction under conditions of pitch, roll and acceleration so that errors and compass readings due to the earth's vertical field are removed.

The invention thus described offers several advantages. Since sensor 30 is stationarily mounted in rotor 20, the terminals of the sensor may be electrically connected without the necessity of using slip rings. (For example the terminals may extend adjacent the rotary shaft 24.) Since the coil is stationarily mounted within the rotor, the sensor will maintain its shape, will be shielded from certain noise fields, and thus will be able to measure small fields more accurately.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A device for determining the direction of a primary magnetic field comprising, in combination:
    a body mounted for rotation about an axis of rotation and comprising means for defining at least one electrical path disposed transversely to said axis;
    means for rotating said body about said axis;
    means for detecting those secondary magnetic field components induced by rotation of said body in said primary magnetic field which are substantially at a frequency equal to the rotational frequency of said body, and for providing a corresponding first electrical signal responsively to said secondary field components;
    means for generating a variable tertiary magnetic field at said body and at a frequency different from said secondary field;
    means for detecting a fourth magnetic field induced by rotation of said body in said tertiary magnetic field and for providing a second electrical signal responsive to said fourth magnetic field; and
    means for determining the relative phase shift of said first and second electrical signals, said phase shift being related to the direction of said primary field.

2. A device in accordance with claim 1 wherein said body is hollow.

3. A device in accordance with claim 2 wherein said means for defining at least one electrical path comprises a plurality of parallel, electrically-conductive laminations insulated from one another.

4. A device in accordance with claim 3 wherein said body is a substantially closed sphere.

5. A device in accordance with claim 3 wherein said laminations are each disposed in a plane, said plane being oriented at an angle with respect to said axis which is greater than 0° but less than 90°.

6. A device in accordance with claim 5 wherein said angle is 45°.

7. A device in accordance with claim 2 wherein said means for detecting said secondary magnetic field components is located in said hollow body.

8. A device in accordance with claim 1 wherein said axis is substantially parallel to said secondary magnetic field components.

9. A device in accordance with claim 1, wherein said means for generating a tertiary magnetic field is located outside said body.

10. A device in accordance with claim 1, wherein said means for generating a tertiary magnetic field includes a coil and means for energizing said coil at said different frequency.

11. A device in accordance with claim 10, wherein the longitudinal axis of said coil is substantially perpendicular to said axis of rotation.

12. A device in accordance with claim 1, wherein said means for detecting said secondary magnetic field components and said means for detecting said fourth magnetic field comprises a single coil sensitive to both said secondary field components and said fourth magnetic field.

13. A device in accordance with claim 1, wherein said fourth magnetic field is a modulated field having a carrier frequency equal to said different frequency and an envelope frequency equal to said rotational frequency, and said means for detecting said fourth magnetic field includes means for demodulating the component of said field at said rotational frequency.

14. A gyrostabilized compass for determining the direction of the earth's magnetic field comprising in combination:
   an electrically-conductive body mounted for rotation about an axis of rotation and comprising means for defining at least one electrical path disposed transversely to said axis;
   means for rotating said body about said axis;
   means for detecting those secondary magnetic field components induced by rotation of said body in said earth's magnetic field which are substantially at a frequency equal to the rotational frequency of said body and for providing a corresponding first electrical signal responsively to said secondary field components;
   means for generating a variable tertiary magnetic field at said body and at a frequency different from the frequency of said secondary magnetic field components;
   means for detecting a fourth magnetic field induced by rotation of said body in said tertiary magnetic field and for providing a second electrical signal responsive to said fourth magnetic field;
   means for determining the relative phase shift of said first and second electrical signals, said phase shift being related to the direction of said earth's magnetic field; and
   gimbal means for supporting said body so that said body is free to rotate about two mutually perpendicular axes;
   wherein angular momentum imparted by the rotation of said body provides gyrostabilization.

15. A device in accordance with claim 14 wherein said body is hollow.

16. A device in accordance with claim 15 wherein said means for defining at least one electrical path comprises a plurality of electrically-conductive laminations insulated from one another.

17. A device in accordance with claim 16 wherein said body is a substantially closed sphere.

18. A device in accordance with claim 15 wherein said means for detecting said secondary magnetic field components and said means for detecting said fourth magnetic field includes a sensing coil located in said hollow body.

19. A device in accordance with claim 14 wherein said axis is substantially parallel to said secondary magnetic field components.

* * * * *